United States Patent [19]

Arimura

[11] 4,390,955

[45] Jun. 28, 1983

[54] POSITION DETECTING SYSTEM

[75] Inventor: Yoshiaki Arimura, Yokohama, Japan

[73] Assignee: Tokyo Shibaura Denki Kabushiki Kaisha, Kawasaki, Japan

[21] Appl. No.: 269,756

[22] Filed: Jun. 2, 1981

[63] Continuation-in-part of Ser. No. 231,781, Feb. 5, 1981, abandoned, which is a continuation of Ser. No. 77,781, Sep. 21, 1978, abandoned.

[30] Foreign Application Priority Data

Sep. 28, 1978 [JP] Japan .................. 53-118588

[51] Int. Cl.³ .......................................... G01B 11/00
[52] U.S. Cl. .................................. 364/490; 364/559; 358/101
[58] Field of Search ............. 364/490, 491, 559, 560, 364/474; 358/101, 107; 235/92 MP, 92 PD; 318/603, 640; 340/146.3 AC, 146.3 AE

[56] References Cited

U.S. PATENT DOCUMENTS

| | | | |
|---|---|---|---|
| 3,603,728 | 9/1971 | Arimura | 358/101 |
| 3,814,845 | 6/1974 | Huribrink et al. | 358/101 |
| 3,899,634 | 8/1975 | Montone et al. | 358/101 |
| 4,125,798 | 11/1978 | Miller | 364/474 |
| 4,163,212 | 7/1979 | Buerger et al. | 364/490 |
| 4,186,412 | 1/1980 | Arimura | 235/92 MP |
| 4,291,334 | 9/1981 | Mese et al. | 358/101 |

FOREIGN PATENT DOCUMENTS 53-10422 4/1978 Japan .

OTHER PUBLICATIONS

IBM Technical Disclosure Bulletin; Duffy et al., Automatic CCTV Positioning System, vol. 14, No. 8, Jan. 1972, pp. 2348-2350.

Primary Examiner—Gary Chin
Attorney, Agent, or Firm—Oblon, Fisher, Spivak, McClelland & Maier

[57] ABSTRACT

A position detecting system has the following steps of: detecting picture element information (E2) corresponding to patterns on a chip (10) illuminated; calculating threshold information (E3) representing a threshold level (S1, S3) to discriminate a pad pattern (11) from the patterns on the basis of the mean (eH) of a high level portion of the picture element information (E2) and the mean (eL) of low level portion thereof; and calculating a position of the pad pattern (11) from video information (E4) discriminated with respect to the threshold level (S1, S3) by comparing a level of the threshold information (E3) with a level of video information (E4) corresponding to the picture element information (E2) used to calculate the threshold information (E3).

17 Claims, 11 Drawing Figures

F I G. 4
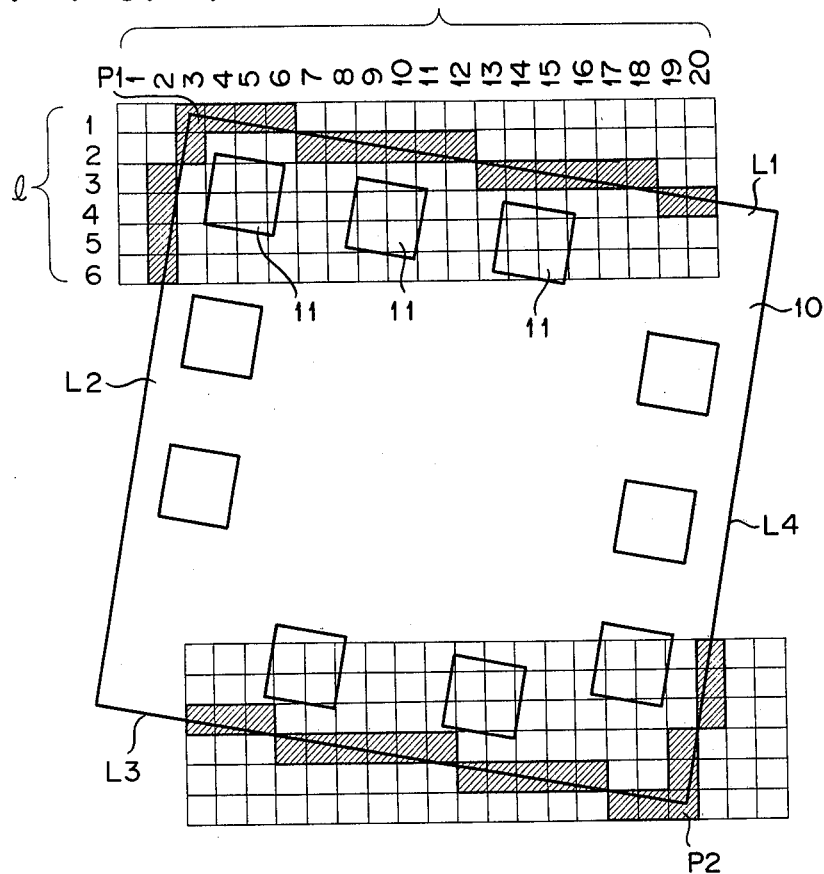
F I G. 5
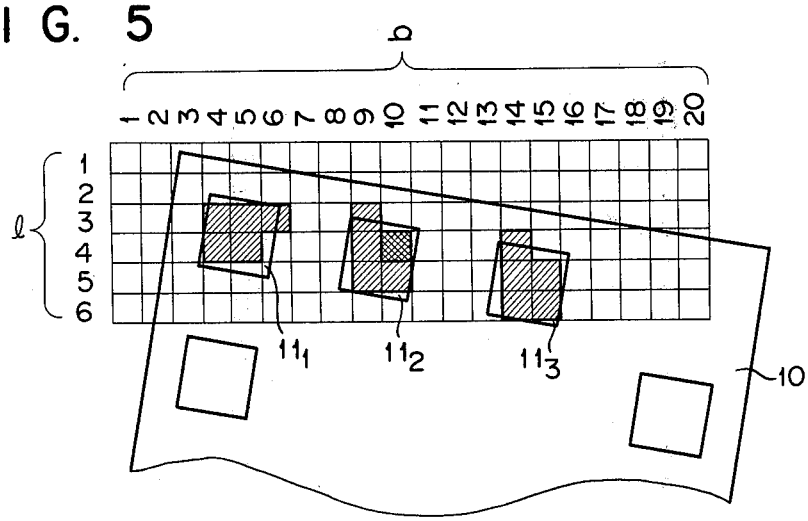

POSITION DETECTING SYSTEM

BACKGROUND OF THE INVENTION

1. Field of the Invention

The present invention relates to position detecting system for specific positions on a minute area such as bonding pad positions on a semiconductor integrated circuit chip.

2. Description of the Prior Art

The bonding process of the semiconductor chip does require very precise detection of a pad position on the semiconductor chip. In general, as shown in FIG. 1, a semiconductor chip 10 is frequently mounted on a mount base 12 or a frame head 14 with a displacement from a given position. An area of a pad 11 of the semiconductor chip 10 connected to a lead 16 made of usually gold is much narrower than each of lead portions 13 on the mount base 12. Therefore, bonding of the lead 16 to the pad 11 requires a higher precision control of the bonding position than bonding of the lead 16 to the lead portion 13. It is for this reason that the edges or the corners of the semiconductor chip 10 are detected without being changed in any way, and using the result of the detection a computer calculates to provide a position of the pad 11, or that a detection mark is marked on the chip 10 and a position of the chip 10 is detected by using the mark. The former method needs a large scale system for the position detection of the chip, and a cracked or chipped edge of the chip 10 often causes a detection error. In the latter method, the mark negatively affects the semiconductor chip 10, often leading to deterioration of the performance. Additionally, the marking cannot uniformly be applied to various types of the semiconductor chips 10. This fact hinders the bonding process of the semiconductor chip 10 from being automated. Further, the marking is not necessarily applied to all types of semiconductor chips. Therefore, it is very difficult to automate the bonding process of the semiconductor chip 10.

SUMMARY OF THE INVENTION

Accordingly, an object of the invention is to provide a position detecting system capable of accurately detecting a position of a semiconductor chip without adversely affecting the semiconductor chip in a simple and easy manner and thus enabling the bonding process, for example, to be automated easily.

In summary, a position detecting system according to the invention firstly illuminates a semiconductor chip to be subjected to a position-detection and picks up an image of the semiconductor chip. For protecting a function of semiconductor elements, the semiconductor chip, except the edge and the pad, is covered with a passivation film or a protecting film. Accordingly, by applying a proper illumination, only the pad image on the chip can be picked up with the image particularly brightened. The pad image thus picked up is electrically scanned and picture element signals thus obtained are used to detect a pattern of pads arranged on the semiconductor chip. A position of the semiconductor chip is detected by using picture element information obtained by sampling the picture element signal.

The position detecting system according to the invention always changes a threshold level used for sampling the pad into a proper value in accordance with picture element information obtained for each frame scanning. Therefore, the level to detect the pad is automatically and constantly adjusted to be a proper value even if the kind of the chip, the condition of the illumination, or the like change.

BRIEF DESCRIPTION OF THE DRAWINGS

A better understanding of the invention may be obtained from a consideration of the following detailed description taken in conjunction with the accompanying drawings, in which:

FIG. 4 shows a chip pattern for illustrating how to detect the edges of a semiconductor chip by using the device shown in FIG. 2;

FIG. 5 shows a pattern for illustrating how to detect the center of the semiconductor chip by using the device shown in FIG. 2;

DESCRIPTION OF THE PREFERRED EMBODIMENT

Figure 2:
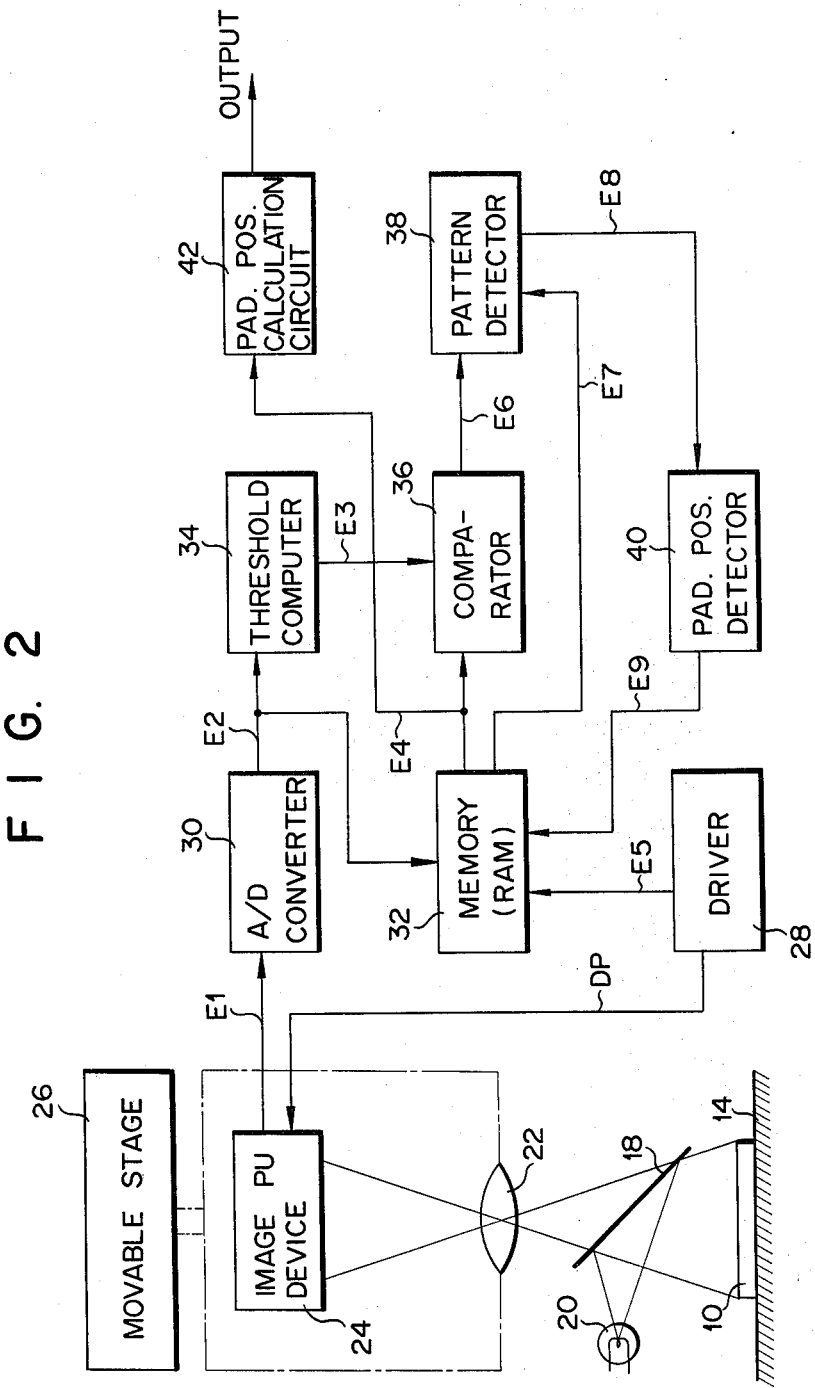
FIG. 2 shows a block diagram of one embodiment of a device applicable for a position detecting system according to the invention.
Figure 11A:
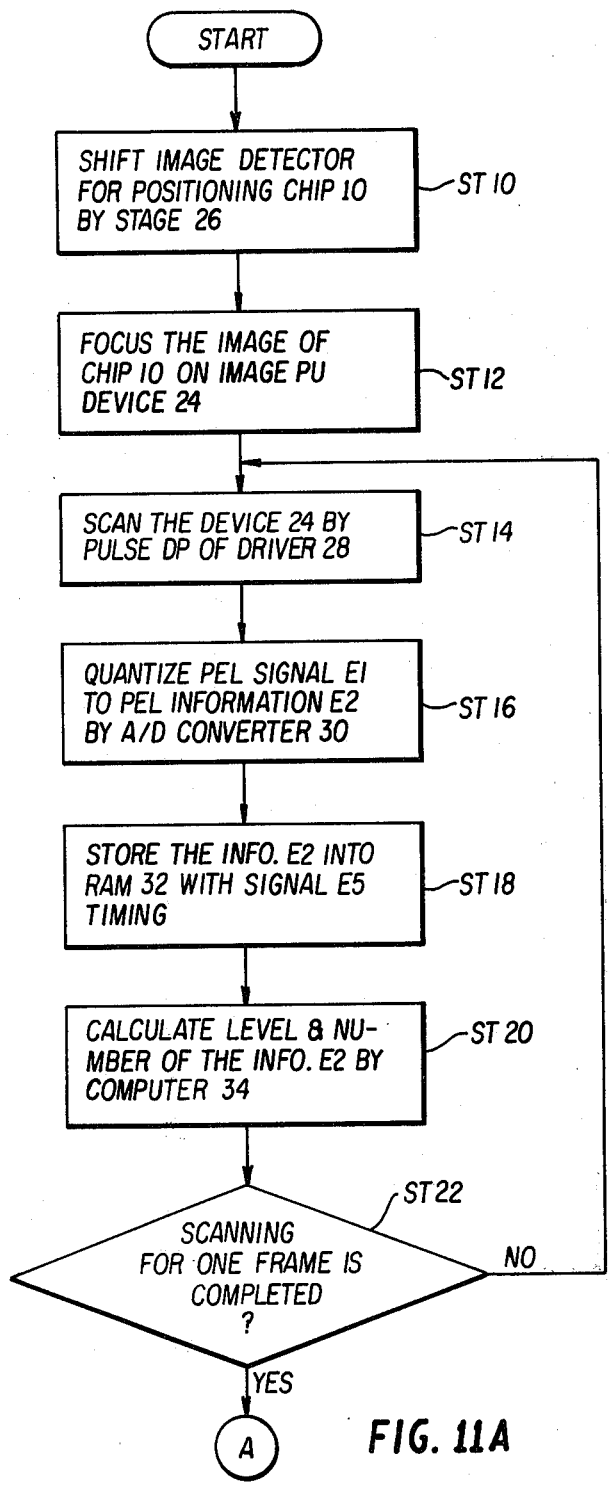
FIGS. 11a to 11c show a flow chart illustrating the operation of the circuit shown in FIG. 2.
Figure 11B:
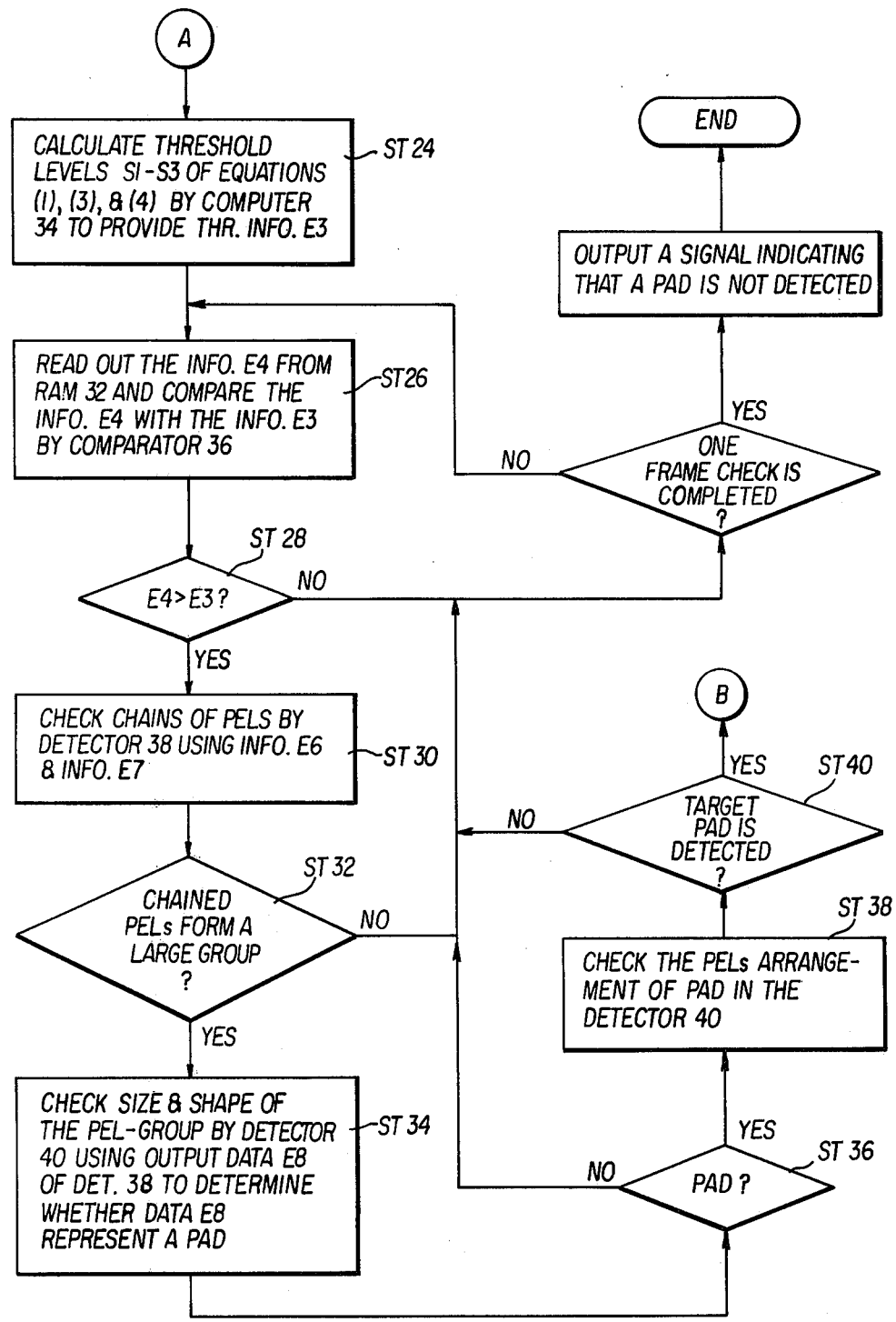
Figure 11C:
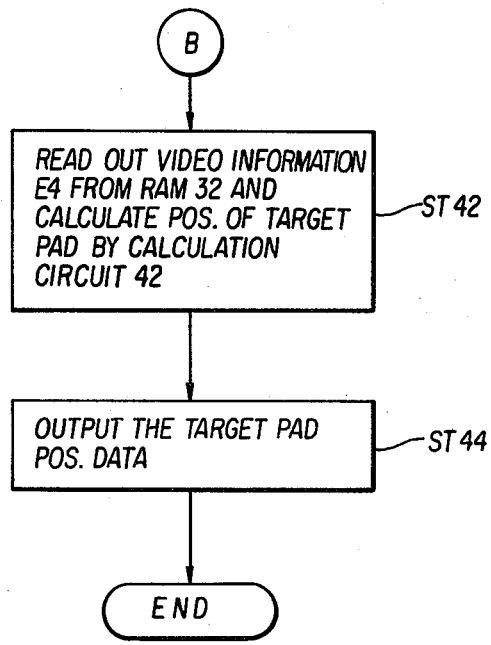

Reference is first made to FIG. 2 illustrating one embodiment of a position detecting system according to the invention, and secondly to FIGS. 11a to 11c showing the operational flow thereof. As shown in the figure, a semiconductor chip 10 to be subjected to a position detection is illuminated by a light source 20, through a half mirror 18. An image of the chip 10 is collected by a lens 22 to be focused onto an image pick-up surface of an image pick-up device 24 (step 12 in FIG. 11a). The pick-up device 24 may be constructed by using common type solid state image pick-up elements (semiconductor image sensors). In the image pick-up device, six horizontal scannings are performed per frame and each scanning line is resolved into 20 segments. In other words, the image pick-up device 24 has a picture element (PEL) resolution represented by 6 (l1 to l6) in horizontal $\times$ 20 (b1 to b20) in vertical. Accordingly, the image pick-up device 24 produces picture element signals representing an image of the semiconductor chip with 120 ($=6\times 20$) picture elements for each frame. In construction, the image pick-up device 24 includes the lens 22 and is interlocked with a movable stage 26. Preceding the aforementioned step 12, the device 24, together with the stage 26, is moved relatively with the chip 10 to be positioned (step 10 in FIG. 11a). The movement of the device 24 is controlled by a drive pulse DP derived from a driver 28. Under control of the drive pulse DP from the driver, the device 24 shifts the picture element signal picked up to produce an analog picture element signal E1 every horizontal scanning line (step 14 in FIG. 11a).

The picture element signal E1 produced every scanning line is converted into a digital picture element information E2 by an analog to digital (A/D) converter 30 (step 16 in FIG. 11a). The information E2 is stored in a memory 32 in accordance with the scanning in the device 24 and at the same time is applied to a threshold computer 34 (step 18 in FIG. 11a). On the basis of the 120 pieces of picture element informaton E2 the computer 34 calculates detection levels of the picture elements, i.e. threshold levels (step 20 in FIG. 11a). In this embodiment, the picture element information E2 is classified into voltage levels corresponding to the picture element data. A specific threshold level is obtained every scanning (every frame) in the image pick-up device 24 (YES of step 22 in FIG. 11a) on the basis of at least the maximum and the minimum level of those voltage levels. The threshold level is used to perform the binary comparison/decision of the video information level corresponding to the picture element information E2.

Of those picture element information of 120, 40 pieces of picture element information E2 at higher level are calculated to provide the mean maximum value $\bar{e}H$ and the remaining 60 pieces of picture element information E2 at lower level are calculated to provide the mean minimum value eL. In order to avoid a bad influence by an undesired reflection from the chip surface or the reflection by a soldering member jutting out from the edge of the chip 10 when the chip is mounted, a threshold level S1 is given by the following equation:

$$S1 = (\bar{e}H - \bar{e}L)/2 + \bar{e}L \tag{1}$$

Figure 1:
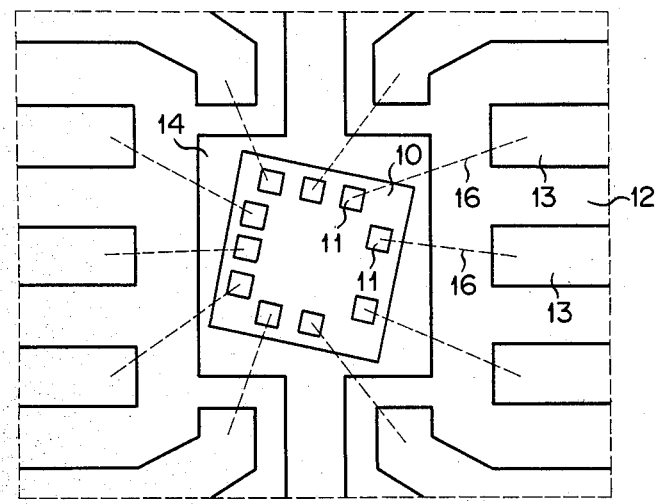
FIG. 1 shows a part of a mounted integrated circuit illustrating how a semiconductor chip is mounted on a mount base, slightly slanting from its given position.
Figure 3:
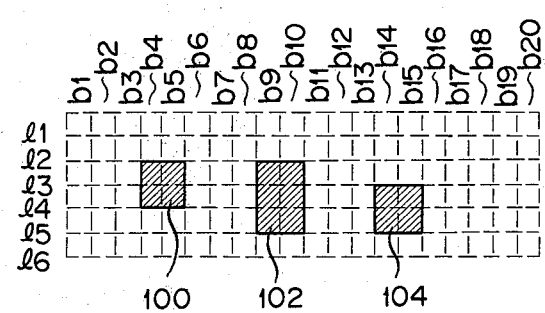
FIG. 3 illustrates chip patterns detected by an image pick-up device shown in FIG. 2.

The threshold level S1 calculated by the computer 34 is applied from the computer 34 to a comparator 36 in the form of threshold level information E3 (step 24 in FIG. 11b). When the information E3 is applied to the comparator 36, video information E4 is applied from the memory 32 to the comparator 36. The information E4 corresponds to the picture element information E2 used when the threshold level information E3 is calculated. The output timing of the information E4 is determined by a signal E5 applied from the driver 28. The comparator 36 sequentially compares the threshold level S1 dependent on the information E3 with the information E4 inputted in accordance with a two dimensional array of a number of light sensing elements which constitute the solid state image pick-up elements of the image pick-up device 24 (step 26 in FIG. 11b). The information E4 which higher level than the level S1 from the comparator 36 is loaded as pattern information E6 in a pattern detector 38. The loading is performed at the timing of a signal E7 applied from the memory 32 to the detector 38 (YES of step 28 in FIG. 11b). For example, when patterns as shown in FIG. 3 are scanned, the addresses representing the information E6 corresponding to the slanted portions of patterns 100, 102 and 104 are inputted as data representing the information E4 larger than the level S1 to the detector 38 (step 30 in FIG. 11b). Those addresses are denoted as (l3, b4) (l3, b5) (l4, b4) (l4, b5); (l3, b9) (l3, b10) (l4, b9) (l4, b10) (l5, b9) (l5, b10); (l4, b14) (l4, b15) (l5, b14) (l5, b15). Those data are classified into the following three groups continuously chained which are showing the patterns 100, 102 and 104: (l3, b4) (l3, b5) (l4, b4) (l4, b5); (l3, b9) (l3, b10) (l4, b9) (l4, b10) (l5, b9) (l5, b10); and (l4, b14) (l4, b15) (l5, b14) (l5, b15). Depending on the three groups of data, the rough coordinates of pad patterns detected are calculated in the detector 38 and the calculated results or data E8 are applied to a pad position detector 40 (YES of step 32 in FIG. 11b). The detector 40 compares the coordinates of a reference pattern corresponding to a known pattern of the chip 10 previously stored with coordinates of the rough pattern coordinates of the data E8 (step 34 in FIG. 11b), thereby to select the data representing the target pad (YES of step 36 in FIG. 11b). The data E9 selected by the detector 40 is then transferred to the memory 32.

In order to obtain the rough coordinates of each pattern, calculation is made of the sum T of the voltage levels of the video information E4 representative of each pattern group, the sum Tli of the voltage levels of the information E4 for each scanning line, and the sum Tbj of the information E4 for each picture element position (step 38 in FIG. 11b). The level sums Tli and Tbj are then accumulated for each scanning line and each picture element position thereby to obtain $\Sigma$Tli and $\Sigma$Tbj. The scanning line li and the picture element position bj are obtained when the following equations hold. They are used as the rough pattern coordinates.

$$\Sigma Tli > T/2 \tag{2A}$$

$$\Sigma Tbj > T/2 \tag{2B}$$

The rough coordinates of each pattern 100 to 104 shown in FIG. 3 calculated by the equations (2A) and (2B) follows. In the description, for ease of illustration, the information level of an address corresponding to the hatched portion is expressed by level '1' and that for the white portion by level '0'.

(1) Pattern 100

The level sum of the video information E4 is 4-segments, $T = 4 \rightarrow T/2 = 2$ $$\sum_{i=3}^{3} Tli = 2, \sum_{i=3}^{4} Tli = 4 \tag{i}$$

Accordingly, when $$\sum_{i=3}^{4} Tli \ (i = 4),$$

the equation (2A) holds. At this time, the addresses detected are (l4, b4) and (l4, b5).

$$\sum_{j=4}^{4} Tbj = 2, \sum_{j=4}^{5} Tbj = 4 \tag{ii}$$

Accordingly, when $$\sum_{j=4}^{5} Tbj \ (j = 5),$$

the equation (2B) holds. At this time, the addresses detected are (l3, b5) and (l4, b5).

(iii) The address commonly detected in items (i) and (ii) is (l4, b5). Accordingly, the address (l4, b5) is the rough target cordinates of the pattern 100.
(2) Pattern 102

The level sum T of the video information E4 is 6, $T=6 \rightarrow T/2=3$.

$$\sum_{i=3}^{3} Tli = 2, \sum_{i=3}^{4} Tli = 4 \qquad (i)$$

Accordingly, when $$\sum_{i=3}^{4} Tli \, (i = 4),$$

the equation (2A) holds. At this time, the addresses detected are (l4, b9) and (l4, b10).

$$\sum_{j=9}^{9} Tbj = 3, 9 \sum_{j=9}^{10} Tbj = 6 \qquad (ii)$$

Accordingly, when $$\sum_{j=9}^{10} Tbj \, (j = 10),$$

the equation (2B) holds. At this time, the addresses detected are (l3, b10), (l4, b10) and (l5, b10).

(iii) From items (i) and (ii), the rough coordinates of the pattern 102 is expressed by the address (l4, b10).
(3) Pattern 104

Like the case of the pattern 100, $T/2=2$
(i) When $$\sum_{l=4}^{5} Tli = 4 \, (i = 5),$$

the equation (2A) holds, and the addresses (l5, b14) and (l5, b15) are detected.
(ii) When $$\sum_{j=14}^{15} Tbj = 4 \, (j = 15),$$

the equation (2B) holds, and the addresses (l4, b15) and (l5, b15) are detected.

(iii) From items (i) and (ii), the address (l5, b15) is the rough coordinates of the pattern 104.

If the position of the target bonding pad is set to the intermediate pattern among the patterns 100 to 104, the rough center coordinates of a pad to be position-detected is expressed by the address (l4, b10) (yes of step 40 in FIG. 11B).

The above description is directed at how to obtain the center coordinates of the target pad directly from the picture element information E2. The center ccordinates of the target pad, however, may be indirectly determined by obtaining the edge lines of the chip 10 or the contour of the chip 10. The explanation to follow is how to detect the target pad from the edge lines of the chip 10.

The edge portion of the chip 10 is not covered with $SiO_2$ film or the like, like the pad. Therefore, the reflecting light from the edge portion may be more intensified than those from the chip surface inside the edges and the frame portion outside the edges. However, the intensity of the reflecting light from the edge portion is weaker than that of the reflecting light from the center of the pad. For this, a threshold level S2 for detecting the edge portion is specially defined as follows:

$$S2 = (\bar{e}H - \bar{e}L)/7 + \bar{e}L \qquad (3)$$

The coefficient 1/7 in the first term on the right side in the equation (3) is empirically determined but may be properly changed in accordance with the kind of the chip 10, the way of illumination and the like.

The picture element signal E1 including the chip edge information produced from the image pick-up device 24 is converted into the digital picture element information E2 by the A/D converter 30, and then the converted one is inputed to the memory 32 and also to the threshold computer 34. In this case, the computer 34 calculates the threshold level S2 shown by the equation (3) and the level S2 is applied to the comparator 36 as the threshold information E3. Upon receipt of this, the comparator 36 selects the video information E4 larger than the level S2 and the selected information is applied to the pattern detector 38 as the pattern information E6 representing the chip edge. The data detected at this time corresponds to the hatched portion in FIG. 4, for example. In other words, the information level at the edge portion of the chip 10 is discriminated depending on the threshold level S2 in the equation (3).

The chip surface inside the edge lines and the frame portion outside of the edge lines of the chip 10 are discriminated as their levels are below the level S2. In this case, however, the pad 1 on the chip 10 is not discriminated, since the information level of the pad 11 is higher than that of the edge portion. Incidentally, the information level of the pad 11 is higher than the threshold level S1 in the equation (1). Accordingly, when there is a need for removing the data corresponding to pad 11, a proper level S'2 higher than the level S2 but lower than the level S1 is used so as not to detect the video information E4 corresponding to the pad 11. In other words, the chip edge is detected between slice levels of the levels S2 and S'2.

Depending on the pattern information E6 representative of the edge lines thus detected, the pad position detector 40 calculates the edge lines L1 to L4 shown in FIG. 4, for example. The address data representing the hatched portion shown in FIG. 4 is reported to the memory 32 and the contents of the address is transferred to the pad position calculation circuit 42. The calculation circuit 42 calculates a configuration or contour of the chip 10 from the address representative of the hatched portion shown in FIG. 4, i.e. the position data of the edge lines L1 to L4. As a cross point of the edge lines L1 and L2, one corner position P1 of the chip 10 is obtained. As a cross point of the edge lines L3 and L4, the other corner position P2 located opposite to the position P1 is obtained. When the two positions P1 and P2 are obtained, one knows a relative position of the chip 10 on the mount base (not shown) of the bonding machine.

The size of the chip 10 and the given positions of the pads 11 have been known at the stage of the chip pattern design. Accordingly, one of the contour or delineation of the chip 10 is determined, the position of the pad 11 may be geometrically obtained. According to this method, the cross points P1 and P2 may be mathematically obtained, so that, even if four corners are chipped, the cross point positions or the original corners may correctly be obtained.

Alternately, by calculating the inclinations of at least two of those edge lines L1 to L4, for example, the edge lines L1 and L2, or by calculating an inclination of the edge line L1 and the cross point position P1, the center coordinates of the target pad on the chip 10 may be obtained on the basis of the pattern information E6 representing the edge lines.

For example, in the pattern as shown in FIG. 3, assume that the address (l1, b1) is obtained as the cross point position P1 and the inclination of the edge Line L1 is zero. On this assumption, positions where the patterns 100, 102 and 104 are located with respect to the address (l1, b1,) are known. Therefore, the following addresses representing the patterns 10, 102 and 104 may be detected; (l3, b4) (l3, b5) (l4, b4) (l4, b5); (l3, b9) (l3, b10) (l4, b9), (l4, b10) (l5, b9) (l5, b10); (l4, b14) (l4, b15) (l5, b14) (l5, b15). After this detection, the above-mentioned calculations are performed by using the equations (2A) and (2B) to obtain the addresses (l4, b5), (l4, b10) and (l5, b15) for the rough central coordinates of the patterns 100, 102, and 104. If the target pad is set at the intermediate location among three patterns, the address (l4, b10) of the pattern 102 is detected as a core of the target pad (YES of step 40 in FIG. 11B).

The operation to obtain the target pad from the contour of the chip 10 may also be performed in the pad position detector 40 (steps 34–40).

Let us consider now a case to detect an address of the video information E4 larger than the threshold level S1 by using the above-mentioned process, with respect to the pattern in FIG. 5. In this case, the positions representing the information levels larger than the level S1 are as indicated by hatched line, with respect to the pads 11$_2$, the positions (l3, b9) (l4, b9) (l4, b10) (l5, b9) and (l5, b10) are detected as the addresses representing the information levels higher than the level S1. Those addresses are chained to form one address group. In the case of FIG. 5, the pattern of the pad 11$_2$ is further detected at other positions than those of the above-mentioned address group. That is, as indicated by the hatched portions in FIG. 6, the peripheral patterns around the pad 11$_2$ also at the positions (l3, b10) (l3, b11) (l4, b8) (l4, b11) (l5, b8) (l5, b11) and (l6, b10) are detected by the image pick-up device 24. Although the peripheral patterns are detected in this way, the information levels of the addresses corresponding to those positions are below the threshold level S1, so that, when the level S1 is used for image picking up, the peripheral patterns around the pad 11$_2$ cannot be picked up. In order to pick up those peripheral patterns, a threshold level S3 is set up as follows:

$$S3 = (\bar{e}H - \bar{e}L)/7 \times 2 + \bar{e}L \quad (4)$$

The equation (4) is empirically formed through various simulation experiments but is allowed to be modified case by case. The threshold level S3 thus obtained is applied as the threshold level information E3 to the comparator 36, so that the peripheral patterns can be obtained. In this way, the addresses around the address (corresponding to the meshy portion in FIG. 5) indicating the central coordinates of the pad 11$_2$ already calculated are compared with the level S3 and only those (the hatched portions in FIG. 6) higher than the level S3 are applied from the comparator 36 to the detector 38.

Figure 6:
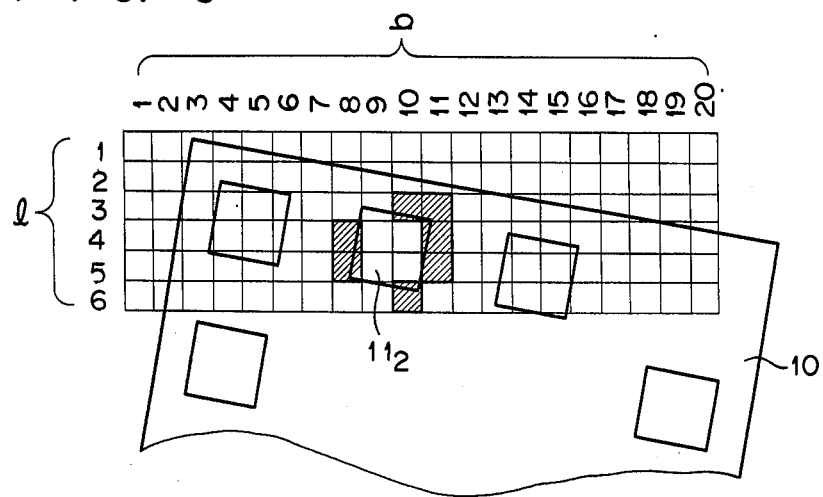
FIG. 6 shows a chip pattern how to detect pad edges of a pad on a semiconductor chip.

By using the information thus obtained, the pad position detector 40 detects the target pad as in the following manner. Assume now that the pad 11$_2$ shown in FIGS. 5 and 6 is the target pad 11$_2$. The detector 38 stores the address data at the positions as indicated by the hatched lines on the pad 11$_2$ (FIG. 5) as the information levels larger than the threshold level S1, and stores the address data at the positions as indicated by the hatched lines around the pad 11$_2$ shown in FIG. 6 as the information levels larger than the threshold level S3 but less than S1. Those data are selectively picked up by the pad position detector 40 and it is reported to the memory 32.

Through the above-mentioned procedure by using the equations (2A) and (2B), the detector 38 calculates the rough coordinates about the hatched pattern on the pad 11$_2$ in FIG. 5. In the case of FIG. 5, the position (l4, b10) is obtained as the rough coordinates, and the address data representing the position with a higher information level than the level S3 is selectively extracted by the pad position detector 40. In other words, the address data (l3, b9), (l3, b10) (l3, b11) (l4, b8) (l4, b9) (l4, b10) (l4, b11) (l5, b8) (l5, b9) (l5, b10) (l5, b11) (l6, b10), which are hatched on the pad 11$_2$ shown in FIGS. 5 and 6, are reported from the detector 38 to the detector 40. Upon this, those address data are transferred to the pad position calculation circuit 42 through the memory 32 (step 42 in FIG. 11c).

In the calculation circuit 42, the video information E4 stored in the addresses indicated by the hatched portions in FIGS. 5 and 6 are subjected to an addition operation. Through the addition operation, the totals of the scanning lines l3 to l6 (Tl3 to Tl6), and the totals of the picture element positions b8 to b11 (Tb8 to Tb11) are obtained. From those totals, the center position of the scanning lines and the picture elements relating to the target pad 11$_2$ is obtained in the following manner. Firstly, the total T of the information levels including the entire area of the target pad 11$_2$ detected is calculated by using the following equation $$\sum_i Tl_i = \sum_j Tb_j = T \quad (5)$$

And by using the following equations, the center position is calculated $$\Sigma Tl_i > T/2 \quad (6)$$

$$\Sigma Tb_j > T/2 \quad (7)$$

For ease of understanding, with respect to the pad 11$_2$ shown in FIGS. 5 and 6, the information level of the hatched portion is expressed by level '1', the information level of the white portion by level '0'. On the assumption from the equation (5), we have $$T = \sum_{i=3}^{6} Tl_i = \sum_{j=8}^{11} Tb_j = 12$$

Therefore, $T/2 = 6$.

Since $Tl3 = 3$ and $Tl4 = 4$, when $i = 4$, i.e. $Tl3 + Tl4 = 7$, the equation (6) holds. Accordingly, the center of the scanning line becomes l4 for $i = 4$. Further, since $Tb8 = 2$, $Tb9 = 3$, and $Tb10 = 4$, the equation (7) holds when $j = 10$, i.e. $Tb8 + Tb9 + Tb10 = 9$. Accordingly, the center of the picture element b$_j$ becomes b10 for $j = 10$.

Figure 7:
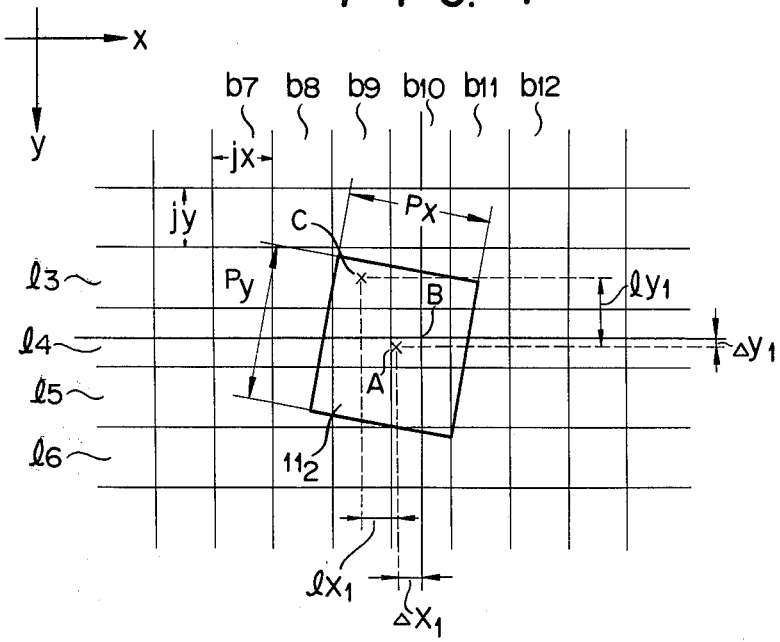
FIG. 7 is an illustration of how to obtain an actual position A of a desired pad pattern from a rough pad position B obtained on the basis of the pattern shown in FIG. 5 or a known pad position C previously set.

With a reference of the center position (l4, b10) of the pad $11_2$ thus obtained, what the actual center position for the pad $11_2$ is distanced from the position (l4, b10) is obtained in the following manner. In FIG. 7, a geometrical center position of the target material or the actual position is indicated as A and the position (l4, b10) as B. Further, the horizontal size of the pad $11_2$ is denoted as Px and the vertical size as Py. The displacement between the positions A and B in an x-direction is denoted as $\Delta$y1. Here, the x direction indicates the scanning direction and the y direction indicates the vertical direction to the scanning direction. Those displacements $\Delta$x1 and $\Delta$y1 are expressed by the following equations:

$$\Delta x1 = \frac{(Tb8 + Tb9) - (Tb10 + Tb11)}{T} \times Px \qquad (8)$$

$$\Delta y1 = \frac{(Tl3 + Tl4) - (Tl5 + Tl6)}{T} \times Py \qquad (9)$$

In the above equations (8) and (9), T is the total of the picture element information extracted and is given by the equation (5). The operations by the equations (5) to (9) are performed by the calculation circuit 42. The solutions of the equations (5) to (7) provide a position B in FIG. 7. Depending on the displacements $\Delta$x1 and $\Delta$y1 obtained by resolving the equations (8) and (9) and the position B, data representing the actual position A of the pad $11_2$ is calculated. The calculated data produced from the calculation circuit 42 is outputted to a bonding machine (not shown) (step 44 in FIG. 11c). Upon receipt of the data, the bonding machine is controlled so as to perform the bonding of leads with a target of the position A. The position B to obtain the position A is calculated from the pattern information detected, as described above.

Another method may also be used to obtain a position for calculating the position A. The pad positions on the semiconductor chip are known at the stage of its design. Accordingly, a position on the mount base of the bonding machine where the chip is located is previously known, although it suffers from a slight amount of error.

In FIG. 7, the semiconductor chip 10 is correctly set on the mount base (not shown), a position where the center of the pad $11_2$ is to be located is (l3, b9), for example. The center position (l3, b9) previously known is denoted as C. When the chip 10 is ideally or correctly located on the mount base, the position A and the position C are coincident with each other.

Assume now that the size of the scanning picture element or the address block (li, bj) is jx, jy. On this assumption, a displacement between the positions C and B in the x-direction is expressed by (b10−b9)xjx. A displacement therebetween in the y-direction is expressed by (l4−l3)xjy. A displacement between the positions B and A, $\Delta$x1 and $\Delta$y1, may be obtained by the equations (8) and (9). Accordingly, a displacement lx1 of the position A in the x-direction to the position C and a displacement ly1 in the y-direction to the same are given by the following equations:

$$lx1 = (b10 - b9)xjx + \Delta x1 \qquad (10)$$

$$ly1 = (l4 - l3)xJY + \Delta y1 \qquad (11)$$

In other words, by operating the equations (10) and (11) with respect to the known position C, the actual center position A of the bonding pad may be obtained.

The operations of the equations (8) and (9) to obtain the displacements $\Delta$x1 and $\Delta$y1 are performed in the pad position calculation circuit 42. However, it is evident that the operations of the equations (10) and (11) are not necessarily performed by the calculation circuit 42 but may be performed by the control unit (not shown) of the bonding machine.

If two position displacements lx and ly as indicated by the equations (10) and (11) are calculated on an identical semiconductor chip, one knows not only the position displacement $\Delta$x0 and $\Delta$y0 of the chip mounted relative to a given position of the mount base of the bonding machine, but also angular displacement $\theta$ at the displaced position.

Figure 8:
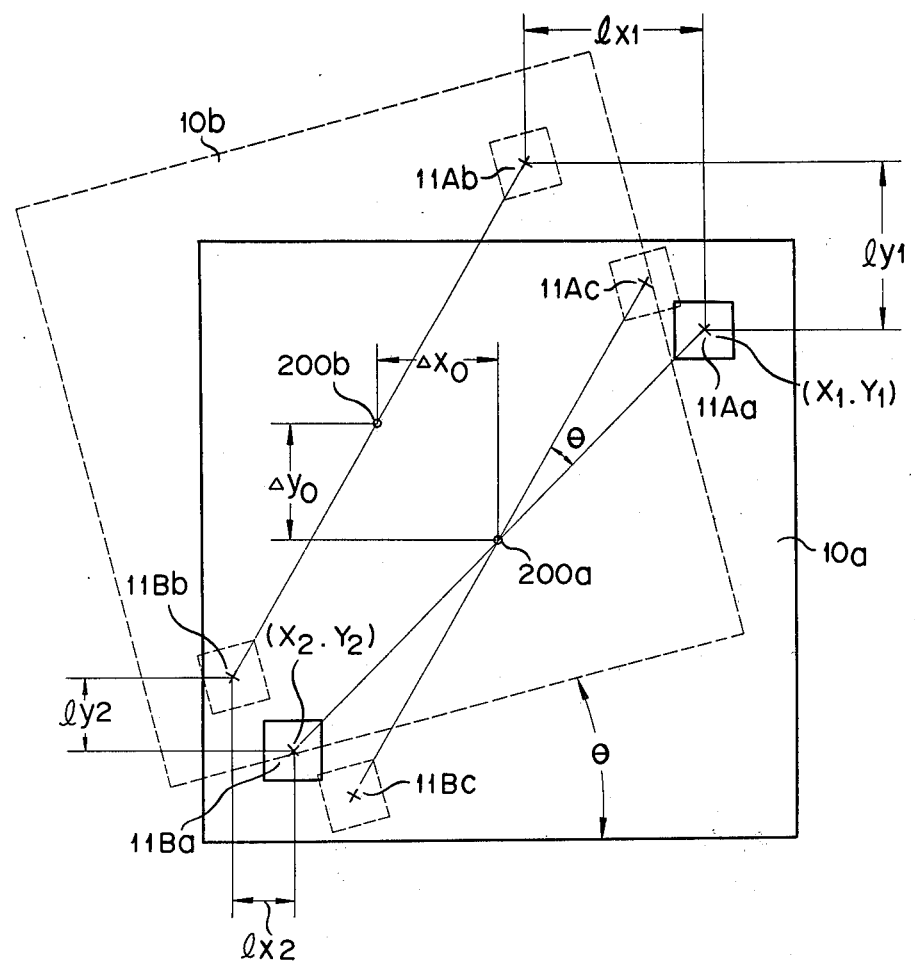
FIG. 8 shows an illustration of how to obtain an inclination and a displacement of a chip 10b actually mounted to a chip 10a located in accurate position by obtaining two target pad patterns.

FIG. 8 shows a diagram for illustrating the position placements $\Delta$x0 and $\Delta$y0 and the angular displacement $\theta$. In the figure, a square block enclosed by a bold line denotes a chip 10a set at a given position on the mount base. A square block enclosed by a broken line denotes a chip 10b which inclines by an angle $\theta$ with respect to the given position and is displaced by $\Delta$x0 in the x-direction and by $\Delta$y0 in the y-direction. The coordinates (X1, Y1) and (X2, Y2) of two pads 11Aa and 11Bb are already known. A displacement (lx1, ly1) of the pad 11Ab from the pad 11Aa is obtained by detecting the picture element information around the pad 11Ab of the chip 10b. Similarly, a displacement (lx2, ly2) of the pad 11Bb from the pad 11Ba may be obtained by detecting the picture element information around the pad 11Bb of the chip 10b.

As indicated by a line connecting pads 11Ac and 11Bc in FIG. 8, when a line connecting the pads 11Ab and 11Bb is properly translated in parallel, it crosses a line connecting the pads 11Aa and 11Ba. An angle developed by those lines indicates an inclination of the chip 10b with respect to the chip 10a. The angle $\theta$ is calculated by using already known coordinates data (X1, Y1) and (X2, Y2) and the displacement data (lx1, ly1) and (lx2, ly2) obtained by resolving the equations (10) and (11). That is, the angle $\theta$ is given by the following equation:

$$\theta = \tan^{-1}\frac{Y1 - Y2}{X1 - X2} - \tan^{-1}\frac{(Y1 - Y2) + (ly1 - ly2)}{(X1 - X2) + (lx1 - lx2)} \qquad (12)$$

Using the known data (X1, Y1) and (lx1, ly1) and the angle $\theta$ obtained by the equation (12), we have the displacements $\Delta$x0 and $\Delta$y0 by the following equation $$\begin{pmatrix} \Delta x0 \\ \Delta y0 \end{pmatrix} = \begin{pmatrix} X1 + lx1 \\ Y1 + ly1 \end{pmatrix} - \begin{pmatrix} \cos\theta - \sin\theta \\ \sin\theta + \cos\theta \end{pmatrix} \begin{pmatrix} X1 \\ Y1 \end{pmatrix} \qquad (13)$$

In FIG. 8, for ease of illustration, the displacements $\Delta$x0 and $\Delta$y0 are for a separation between the center position 200a of the chip 10a and the center position 200b of the chip 10b.

The operations of the equations (12) and (13) are performed by the calculation circuit 42 shown in FIG. 2 but may also be performed by the control unit of the bonding machine (not shown). Through this operation, the actual position of the chip 10b actually mounted is calculated. The displacement data $\theta$, $\Delta$x0 and $\Delta$y0 obtained from the equations (12) and (13) are transferred to the control unit of the bonding machine where necessary calculation for the bonding is performed.

The respective blocks 34, 38, 40 and 42 shown in FIG. 2 may be constructed by using conventional CPUs and memories without using any specially designed hardware.

Figure 9:
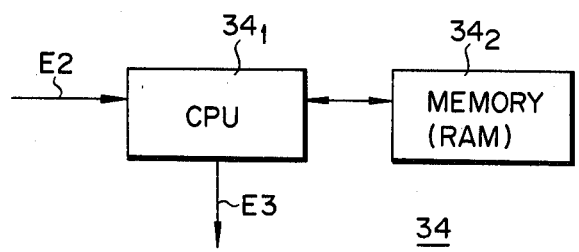
FIG. 9 shows a block diagram of a threshold computer used in the circuit shown in FIG. 2.

Turning now to FIG. 9, there is shown a concrete construction of the threshold computer 34 shown in FIG. 2. The digital picture element information E2 is applied to a CPU $34_1$ coupled with a memory $34_2$. The respective addresses of the memory $34_2$ are assigned in accordance with the levels of the information E2. For example, the maximum level of the information E2 is assumed to be V. The addresses 100 to 110 are assigned to levels 0 V, 0.1 V, 0.2 V, ... 1.0 V, respectively. When constructed by 7 bits, each address may be used as a binary counter capable of counting up to $2^7 = 128$. Accordingly, the binary counter is enough to process the information derived from the image pick-up device 24 having a picture element resolution of 6 in horizontal by 20 in vertical.

The level of the information E2 falls within a range from 0 V to 1.0 V. For example, when the level of the information E2 is 0.5 V, the contents of the address 105 assigned to the level 0.5 V is incremented by one. Similarly, when the level of the information E2 is 1.0 V, the contents of the register of the address 110 is incremented by one. In a similar manner, 120 pieces of the information E2 are succeedingly loaded into the addresses 100 to 110. For simplicity, the levels 0 V to 1.0 V are generally expressed by ei (i=0 to 10) and the contents of the addresses 100 to 110 by nj (j=100 to 110). Assume now that occurrences of the information E2 in each level through one scanning operation distribute as shown in Table 1.

TABLE 1

| Level ei (xV) | Addresses | Contents of Register nj (Decimal) | einj (xV) |
|---|---|---|---|
| e0 | 0.0 | 100 | 0 | 0.0 |
| e1 | 0.1 | 101 | 10 | 1.0 |
| e2 | 0.2 | 102 | 20 | 4.0 |
| e3 | 0.3 | 103 | 15 | 4.5 |
| e4 | 0.4 | 104 | 10 | 4.0 |
| e5 | 0.5 | 105 | 5 | 2.5 |
| e6 | 0.6 | 106 | 10 | 6.0 |
| e7 | 0.7 | 107 | 10 | 7.0 |
| e8 | 0.8 | 108 | 15 | 12.0 |
| e9 | 0.9 | 109 | 20 | 18.0 |
| e10 | 1.0 | 110 | 5 | 5.0 |

As seen from Table 1, through the scanning of one frame, the information E2 corresponding to level 0.1 V occurs ten times and the information E2 corresponding to level 0.9 V occurs 20 times. For each scanning having 120 picture elements, the classification as shown in Table 1 is performed. The contents nj of the register within the address changes every time that a pattern detected by the image pick-up device 24 changes, the chip 10 changes or an illumination condition of the chip 10 changes.

Following the classification as shown in Table 1, the contents nj of the register are read out to the CPU $34_1$ in the order of the addresses 110 to 100. Upon receipt of those contents, the CPU $34_1$ accumulates $\Sigma einj$ until the accumulated value $\Sigma nj$ of the contents of the register becomes a given value P. The mean maximum value $\bar{e}H$ mentioned before is given by the following equation:

$$\bar{e}H = (\Sigma einj)/P \tag{14}$$

When P=40, for example, from the Table 1, the mean maximum value eH is $$\bar{e}H = \frac{e10n110 + e9n109 + e8n108}{P}$$

$$= \frac{5.0 + 18.0 + 12.0}{40} V = \frac{35.0}{40} V = 0.88 V$$

The given value P is determined depending on an area of the bonding pad, for example.

When the mean maximum value $\bar{e}H$ is obtained, the contents nj of the register are successively read out to the CPU $34_1$ in the order of a small level ei to a large level ei, i.e. the addresses 100 to 110. Upon this, the CPU accumulates $\Sigma einj$ until $\Sigma nj$ becomes a given value Q. The mean minimum value $\bar{e}L$ is expressed by the following equation $$\bar{e}L = \Sigma einj/Q \tag{15}$$

When Q=60, for example, from the Table 1, the mean minimum value $\bar{e}L$ is $$\bar{e}L = \frac{e0n100 + e1n101 + e2n102 + e3n103 + e4n104 + e5n105}{Q}$$

$$= \frac{0.0 + 1.0 + 4.0 + 4.5 - 4.0 + 2.5}{60} V + \frac{16.0}{60} V = 0.27 V$$

The given value Q is determined depending on an area of the image pick-up elements of the image pick-up device 24 (for example, ½ or more of the area of the image pickup elements). The first to third threshold levels S1 to S3 are calculated by the CPU $34_1$ by using thus calculated $\bar{e}H$ (=0.88 V) and $\bar{e}L$ (=0.27 V) and the equations (1) to (4), in the following manner:

$$S1 = \frac{0.88 V - 0.27 V}{2} + 0.27 V = 0.58 V$$

$$S2 = \frac{0.88 V - 0.27 V}{7} + 0.27 V = 0.36 V$$

$$S3 = \frac{0.88 V - 0.27 V}{7} \times 2 + 0.27 V = 0.44 V$$

These threshold levels S1 to S3 are outputted from the CPU $34_1$ as the threshold level information E3. From the threshold levels S1 to S3 and Table 1, it is seen that 60 pieces of picture element information classified into the addresses 106 to 110 corresponding to a level higher than S1 (=0.58 V) designates the central part of the bonding pad. Five pieces of the picture element information classified into the adress 105 corresponding to a level lower than S1−(=0.58 V) but larger than S3 (=0.44 V) designates the peripheral portion of the bonding pad. When the slice level to obtain the chip edge is higher than S2 (=0.36 V) but lower than S3 (=0.44 V), 10 pieces of picture element information classified into the address 104 designates a position of the chip edge.

Figure 10:
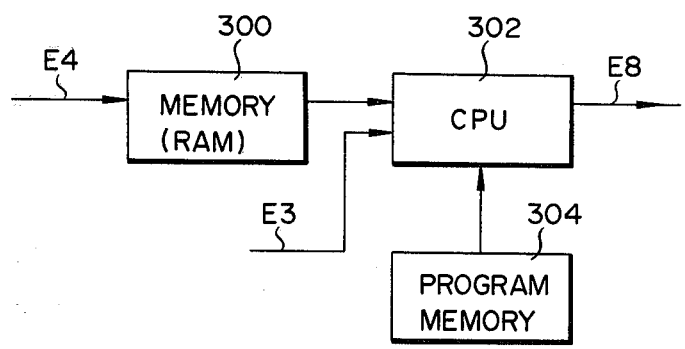
FIG. 10 shows a block diagram of a modification of the combination of a comparator and a pattern detector used in the circuit shown in FIG. 2.

FIG. 10 shows a modification of the combination of the pattern detector 38 and the comparator 36 shown in FIG. 2. The video information E4 is temporarily stored in a memory 300 coupled with a CPU 302 to which the threshold information E3 is inputted. The CPU 302 sequentially reads out the contents of the memory 300 in accordance with the program sequence obtained from a program memory 304 and compares the first threshold level S1 in the information E3 with the contents of the memory 300. When the address storing the contents higher than the level S1 is detected, then the CPU 302 detects an address which stores the contents higher than the third threshold level S3 and is adjacent to the address having the contents higher than the level S1. The address data thus detected is outputted as data E8 representing the target pad pattern. The above-mentioned operation is performed of all the addresses of the memory 300 and the contents of those addresses are compared with two threshold levels S1 and S3.

As described above, an image of the semiconductor chip 10, i.e. a particularly brightened image of the pad 11, is detected as a picture element signal in a sampling area discriminated by the scanning line and the picture element, and the pattern information is obtained form the pattern detection. By using the pattern information, the pattern of the pad at a target position is selected and a displacement from a target position is obtained from the picture element information in the same pattern, and further an angular displacement of the semiconductor chip is obtained in the same way. Therefore, an accuracy of the detection is extremely high, compared with the conventional detecting method using the edge of the chip for the position detection. Further, unlike the conventional method, a position of the target pad 11 is directly obtained, so that an adverse effect such as errounous position detection due to a chipped or cracked edge is eliminated. Further, in the present invention, there is no need for a detection mark marked on the chip per se so that the position detecting system is free from the adverse effect attendant on the use of the detection mark, and troublesome work of the mark attachment. Therefore, the invention easily realizes the bonding apparatus capable of effecting the positioning at a high accuracy, and easily automates the bonding work by the machine. Additionally, the pattern detection is made on the basis of the threshold value S determined depending on the picture element information and therefore it is independent on a condition of chip surface and thus is constantly stable made.

Evidently, the present invention is not limited to the above-mentioned embodiments. For example, the number of the scanning lines of the video signal and the number of picture elements may be selected properly. The position detecting system according to the invention is applicable for any shape of the pad pattern and not limited to the shape shown in the drawings of the above-mentioned embodiment.

As described above, according to the invention, a pad pattern of the semiconductor chip is obtained in the form of an optical image and a position of the chip may easily be made with a high accuracy by using the pattern detection and a level of the picture element signal resulting from the pattern detection. Further, the construction of the system is simple and the position detecting system can directly detect a position of a target pad position regardless of an edge delineation of the chip. Therefore, when the invention is applied to a bonding machine, the machine may fully be automated with a satisfactory accuracy.

Although a specific construction has been illustrated and described herein, it is not intended that the invention be limited to the elements and the constitution disclosed. One skilled in the art will recognize the particular elements or sub-constructions may be used without departing from the spirit of the invention.

What is claimed to be secured by Letters Patent of the United States is:

1. A position detecting method comprising the steps of:
    (a) illuminating a chip to be position-detected to apply pattern information of the chip to image pick-up means through optical means;
    (b) storing temporarily picture element information including a light level distribution corresponding to a pattern on the chip produced from light sensing elements of said image pick-up means to determine a first threshold level for obtaining a first portion of picture element information on the central part of a target pattern to be detected and a second threshold level for obtaining a second portion of picture element information on the peripheral part of the target pattern on the basis of the light level distribution in a manner that the picture element information is classified into proper groups in accordance with levels of the picture element information and a first mean value with a high level is obtained on the basis of a given number of picture element information in the order from high level to low level and a second mean value with a low level is obtained on the basis of a given number of the picture element information in the order from low level to high level;
    (c) obtaining video information of the central part of a target pattern by comparing the picture element information temporarily stored with the first threshold level;
    (d) obtaining peripheral video information corresponding to the peripheral portion around the central portion of the target pattern obtained by comparing the stored picture element information with the second threshold level; and
    (e) calculating a position of the target position from the video information of the central part of the target pattern and the peripheral video information.

2. A position detecting method comprising the steps of:
    (a) illuminating a chip to be position-detected to apply pattern information of the chip to image pick-up means through optical means;
    (b) storing temporarily picture element information including a light level distribution corresponding to a chip patten produced from light sensing elements of said image pick-up means to determine a first discrimination level for obtaining a first portion of picture element information on edge portions of a chip to be detected and a second discrimination level for obtaining a second portion of picture element information on a target pattern on the basis of the level distribution of the picture element information in a manner that the picture element information is classified into proper groups in accordance with levels of the picture element information and a first mean value with a high level is obtained on the basis of a given number of picture element information in the order from high level to low level and a second mean value with a low level is obtained on the basis of a given number of the picture element information in the order from low level to high level;
    (c) obtaining edge video information corresponding to the edge portion of the chip by comparing the picture element information temporarily stored with said first discrimination level;

(d) determining a contour or a delineation of the chip from the edge video information;

(e) calculating a position of said target pattern at a known position with respect to the delineation from the contour or delineation determined;

(f) obtaining pattern video information representing the target pattern by comparing the picture element information corresponding to a position within a given range around the center of the target pattern position calculated from the picture information temporarily stored with said second discrimination level; and (g) calculating a position of the target pattern from the pattern video information.

3. A position detecting method comprising the steps of:

(a) photographing a chip provided on the surface with a bonding pad by image pick-up means with a number of light sensing elements two-dimensionally arranged on a given plane;

(b) storing picture element information including a level distribution corresponding to an analog picture element signal produced from said image pick-up means;

(c) determining a first threshold level for obtaining a first portion of picture element information on the central portion of the bonding pad and a second threshold level for obtaining a second portion of picture element information on the peripheral portion of the bonding pad in a manner that the picture element information is classified into proper groups in accordance with levels of the picture element information and a first mean value with a high level is obtained on the basis of a given number of picture element information in the order from high level to low level and a second mean value with a low level is obtained on the basis of a given number of the picture element information in the order from low level to high level;

(d) obtaining central video information corresponding to the central portion of the bonding pad by sequentially reading out information corresponding to the picture element information used to determine the first and second threshold level from said memory means in accordance with a pattern of light sensing elements of said image pick-up means, and by comparing the information with the first threshold level;

(e) obtaining peripheral video information corresponding to the peripheral portion around the central portion of the bonding pad by comparing the information chained to the central portion of the bonding pad of the picture element information with the second threshold level; and (f) calculating a position of the bonding pad as a target pattern on the basis of the central video information and the peripheral video information.

4. A position detecting method comprising the steps of:

(a) photographing a chip provided on the surface with a bonding pad by image pick-up means with a number of light sensing elements two-dimensionally arranged on a given plane;

(b) storing picture element information including a level distribution corresponding to an analog picture element signal produced from said image pick-up means into a memory means;

(c) determining a first discrmination level for obtaining a first portion of picture element information on the edge of the chip and a second discrimination level for obtaining a second portion of picture element information on the bonding pad in a manner that the picture element information is classified into proper groups in accordance with levels of the picture element information and a first mean value with a high level is obtained on the basis of the given number of picture element information in the order from high level to low level and a second mean value with a low level is obtained on the basis of a given number of the picture element information in the order from low level to high level;

(d) obtaining edge video information corresponding to the edge of the chip by sequentially reading out information corresponding to the picture element information used to determine the first and second discrimination level from said memory means in accordance with a pattern of light sensing elements of said image pick-up means, and by comparing the information with the first discrimination level;

(e) determining a contour or delineation of the chip from the edge video information;

(f) calculating a position of the bonding pad located at a known position relative to the chip contour or the chip delineation determined;

(g) obtaining pad video information representing the bonding pad by comparing picture element information corresponding to a position within a given range around the center of the bonding pad position calculated from the picture element information with the second discrimination level; and (h) calculating a position of the bonding pad as a target pattern from the pad video information.

5. A position detecting method according to any one of claims 1–4, further comprising:

(i) calculating the total (T) of the levels of the video information obtained to calculate the position of the target pattern;

(j) obtaining first subtotals (tli) of the levels of the video information on the respective lines of an X-axis of an array of the light sensing elements in said image pick-up means and second subtotals (Tbj) of the levels of the video information on the respective lines of a Y-axis of the light sensing element array;

(k) determining a presumptive center line of the X-axis, when a first accumulative value ($\Sigma$Tli) obtained by successively accumulating the first subtotals exceeds $\frac{1}{2}$ of the level total ($\Sigma$Tli > T/2), on the basis of the number (i) of the first accumulations, and determining a presumptive center line of the Y-axis, when a second accumulative value ($\Sigma$Tbj) exceeds $\frac{1}{2}$ of the level total ($\Sigma$Tbj > T/2), on the basis of the number (j) of the second accumulations;

(l) obtaining a first difference ((Tb8+Tb9)−(Tb10+Tb11)) representing a difference between the sums of the second subtotals (Tbj) on the right and left regions with respect to the presumptive Y-axis center line, obtaining a first deviation $$\left( \frac{(Tb8 + Tb9) - (Tb10 + Tb11)}{T} \right)$$

by dividing the first difference by the level total (T), and obtaining a first displacement ($\Delta x1$ of the formula (8)), in the X-axis by multiplying the first deviation by a first distance coefficient (Px);

(m) obtaining a second difference $((T13+T14)-(T15+T16))$ representing a difference between the sums of the first subtotals (Tli) on the upper and the lower regions with respect to the presumptive X-axis center line, obtaining a second deviation $$\left( \frac{(TT13 + T14) - (T15 + T16)}{T} \right)$$

by dividing the second difference by the level total (T), and obtaining a second displacement ($\Delta y1$ of the formula (9)) in the Y-direction by multiplying the second deviation by a second distance coefficient (Py); and (n) obtaining the coordinates representing an actual center position (A in FIG. 7) of the target pattern from a presumptive center position (B in FIG. 7) representing a cross point of the presumptive X-axis center line and the presumptive Y-axis center line, and the first and the second displacement ($\Delta x1$ and $\Delta y1$).

6. A position detecting method according to claim 5, further comprising:

(o) obtaining a first product $((b10-b9) \times jx)$ by multiplying a difference $(b10-b0)$ between the video information level (b10) of the Y-axis element line representing the presumptive center position (B) and the video information level (b9) of the Y-axis element line representing a known position (C) by a distance coefficient (jx) of the X-axis element line, in order to obtain a displacement between the known position (C in FIG. 7) representing the target pattern position of the chip with a known pattern and the presumptive center position (B in FIG. 7);

(p) obtaining a third displacement $(lx1=(b10-b9) \times jx+\Delta x1$ in formula (10)) between the presumptive center position (B) and the known position (C) in the X-axis direction by adding the first displacement ($\Delta x1$) to the first product value;

(q) obtaining a second product value $((l4-l3) \times jy)$ by multiplying a difference $(l4-l3)$ between the video information level (l4) of the X-axis element line representing the presumptive center position (B) and the video information level (l3) of the X-axis element line representing the known position (C) by a distance coefficient (jy) of the Y-axis element line;

(r) obtaining a fourth displacement $(ly1=(l4-l3) \times jy+\Delta y1$ in formula (11)) between the presumptive center position (B) and the known position (C) in the Y-axis direction by adding the second displacement ($\Delta y1$) to the second product value; and (s) obtaining the coordinates representing the actual center position (A in FIG. 7) of the target pattern ($11_2$) on the basis of the coordinates of the known position (C), the third displacement (lx1) and the fourth displacement (ly1).

7. A position detecting method according to any one of claims 1-4, further comprising:

calculating at least two target pattern positions (11Aa, 11Bb in FIG. 8) and calculating an inclination ($\theta$) and a displacement ($\Delta x0$, $\Delta y0$) of an actual chip position (10b) relative to the predetermined chip position (10a) from the reference positions (11Aa, 11Ba) corresponding to those target patterns and the target pattern positions (11Ab, 11Bb) calculated; and calculating tow or more target pattern positions in the actual chip position (10b) from data representing the known pattern of the chip, the inclination ($\theta$), and the displacement ($\Delta x0$, $\Delta u0$).

8. A position detecting apparatus comprising:

first means for providing picture element information including a light level distribution corresponding to a pattern of a chip to be positioned-detected wherein said first means further includes means for classifying said picture element information into proper groups in accordance with levels of the picture element information and a first mean value with a high level is obtained on the basis of a given number of picture element information in the order from high level to low level and a second mean value with a low level is obtained on the basis of a given number of the picture element information in the order from low level to high level;

second means having memory cells for storing the picture element information; an address location of said memory cells corresponding to a two-dimensionally arranged pattern of the picture element information detected by said first means with each of said memory cells containing address data of said picture element information;

third means connected to said second means for determining threshold level information for obtaining picture element information on a target pattern to be detected on the basis of the level distribution of the picture element information;

fourth means connected to said second and third means for detecting second video information corresponding to the target pattern on the chip by comparing a first video information corresponding to the information used to determine the threshold level of those pieces of information stored in said second means with the threshold level information; and fifth means for calculating the coordinates of the target pattern from the address data in said second means of a second video information picked up by said fourth means.

9. A position detecting apparatus according to claim 8, wherein said third means calculates a first threshold level for obtaining a first portion of picture element information of the center of the target pattern and a second threshold level for obtaining a second portion of picture element information on the peripheral portion of the target pattern on the basis of a high level mean value and a low level mean value of the picture element information, and provides the first and second threshold levels as the threshold level information.

10. A position detecting apparatus according to claim 8 or 9, wherein said third means calculates a third threshold level for obtaining a third portion of picture element information on the edge portion of the chip on the basis of a high level mean value and a low level mean value of the picture element information thereby to produce the third threshold level as the threshold level information; and said fifth means calculates a contour or delineation of the chip from the address data of said second video information detected by comparing said first video information with the third threshold level and calculating a position of the target pattern from the contour or delination.

11. A position detecting method according to claim 5, further comprising:
(o) calculating a least two target pattern positions (11Aa, 11Bb in FIG. 8) and calculating an inclination ($\theta$) and a displacement ($\Delta x0$, $\Delta y0$) of an actual chip position (10b) relative to the predetermined chip position (10a) from the reference positions (11Aa, 11Ba) corresponding to those target patterns and the target pattern positions (11Ab, 11Bb) calculated; and
(p) calculating two or more target pattern positions in the actual chip position (10b) from data representing the known pattern of the chip, the inclination ($\theta$), and the displacement ($\Delta x0$, $\Delta y0$).

12. A position detecting method according to claim 6, further comprising:
(t) calculating at least two target pattern positions (11Aa, 11Bb in FIG. 8) and calculating an inclination ($\theta$) and a displacement ($\Delta x0$, $\Delta y0$) of an actual chip position (10b) relative to the predetermined chip position (10a) from the reference positions (11Aa, 11Ba) corresponding to those target patterns and the target pattern positions (11Ab, 11Bb) calculated; and
(u) calculating two or more target pattern positions in the actual chip position (10b) from data representing the known pattern of the chip, the inclination ($\theta$), and the displacement ($\Delta x0$, $\Delta y0$).

13. Apparatus for detecting the position of a chip comprising illumination means for applying pattern information of said chip by optical means to an image pick-up means;
means for temporarily storing picture element information including light level distribution corresponding to said pattern on said chip produced by said image pick-up means, and for determining a first threshold level to obtain some of the picture elements in the central part of a target pattern to be detected and a second threshold level to obtain some of the picture elements in the peripheral part of said target pattern on the basis of the level distribution;
picture element information classifying means for classifying said picture element information into proper groups in accordance with levels of the picture element information and producing a first mean value with a high level on the basis of a given number of picture element information in the order from high level to low level and producing a second mean value with a low level on the basis of a given number of the picture element information and the order from low level to high level;
first comparison means for obtaining central video information of said target pattern by comparing picture element information stored temporarily with said first threshold level;
second comparison means for obtaining peripheral video information corresponding to the peripheral portion around the central portion of the target pattern which is obtained by using said second threshold level by comparing the information obtained with respect to the central portion of the target pattern of the picture element temporarily stored with said second threshold level; and
calculating means for calculating a position of the target pattern from the central video information and the peripheral video information.

14. A chip position detecting apparatus comprising:
photographic means including a number of light sensing elements 2-dimensionally arranged on a given plane and image pick-up means for photographing a chip provided on a surface with a bonding path;
storage means for storing picture element information including a level distribution corresponding to an analog picture element signal produced from said image pick-up means;
a level discrimination means for determining a first threshold level for discriminating the central portion of said bonding pad and a second threshold level for discriminating the peripheral portion of the bonding pad in a manner that the picture element information is classified into respective groups in accordance with the levels of said picture element information and a first mean value with a high level that is obtained on the basis of a given number of picture element information in the order from the highest level to the lowest level, and a second mean value with a low level which is obtained on the basis of a given number of picture element information which is in the order of proceeding from the lowest level to the highest level;
central video information processing means for obtaining the central video information corresponding to the central portion of the bonding pad by sequentially reading out information corresponding to the picture element information used to determine said first and second threshold levels from said storage means in accordance with a pattern of light sensing elements of said image pick-up means, and by comparing said information with said first threshold level;
peripheral video information obtaining means for obtaining the peripheral video information corresponding to the peripheral portion around the central portion of said bonding pad by comparing the information pertaining to the central portion of said bonding pad of said picture element information with said second threshold level; and
calculating means for calculating a position of said bonding pad as a target pattern on the basis of said central video information and said peripheral video information.

15. A chip position detecting apparatus comprising:
photographic means including an image pick-up means having a number of light sensing elements 2-dimensionally arranged on a given plane for photographing a chip provided on the surface with a bonding pad;
storage means for storing picture element information including a level distribution corresponding to an analog picture element signal produced from said image pick-up means;
level discrimination means for determining a first discrimination level for discriminating edges of said chip and second discrimination level for discriminating the bonding pad in a manner such that the picture element information is classified into proper groups in accordance with levels of the picture element information and a first mean value with a high level that is obtained on the basis of the given number of picture element information in the order from highest level to the lowest level and a second mean value with a low level which is obtained on the basis of a given number of picture element information in the order from the lowest level to the highest level;

edge video information detection means for obtaining edge video information corresponding to the edge of the chip by sequentially reading out information corresponding to the picture element information used to determine said first and second discrimination levels from said storage means in accordance with a pattern of light sensing elements of said image pick-up means and by comparing said information with said first discrimination level;

contour determining means for determining the contour or delineation of said chip from said edge video information;

calculating means for calculating a position of said bonding pad located at a known position relative to said chip contour or chip delineation determined;

bonding pad video information determining means for obtaining pad video information which represents the bonding pad by comparing picture element information corresponding to a position within a given range around the center of the bonding pad position calculated from picture element information and said second discrimination level; and second calculating means for calculating a position of the bonding pad at a target pattern from said pad video information.

16. The position detecting method according to claims 1, 2, 3 or 4, further comprising the steps of:

calculating the total of the levels of the video information obtained to calculate the position of said target pattern;

obtaining first sub-totals of the levels of video information on the respective lines of an X-axis of an array of said light sensing elements in said image pick-up means and second sub-totals of the levels of said video information on the respective lines of a Y-axis of said light sensing element array;

determining a presumptive center line of the X-axis, when a first accumulated value obtained by successfully accumulating the first sub-totals exceeds one-half of the level total, on the basis of the number (i) of the first accumulations, and determining a presumptive center line of the Y-axis, when a second accumulative total exceeds one-half of the level total on the basis of the number (j) of the second accumulations;

obtaining a first difference representing a difference between the sums of said second sub-totals on the right and left regions with respect to the presumptive Y-axis center line and which obtains a first deviation by dividing said first difference by said level total, and obtains a first displacement in the X-axis by multiplying said first deviation by a first distance coefficient;

obtaining a second difference representing the difference between the sums of the first sub-totals on the upper and the lower regions with respect to the presumptive X-axis center line, obtaining a second deviation by dividing said second difference by said level total and obtaining a second displacement in the Y-direction by multiplying said second deviation by second distance coefficient; and obtaining the coordinates representing an actual center position of the target pattern from a presumptive center position representing a cross point of the presumptive X-axis center line and the presumptive Y-axis center line, and the first and second displacement.

17. A position detecting method according to claim 16, further comprising the steps of:

obtaining a first product by multiplying a difference between the video information level of the Y-axis element line representing the presumptive center position and the video information level of the Y-axis element line representing a known position by a distance coefficient (jx) of the X-axis element line, in order to obtain a displacement between the known position representing the target pattern position of said chip with a known pattern and the presumptive center position;

obtaining a third displacement between the presumptive center position and the known position in the X-axis direction by adding the first displacement to said first product value;

obtaining a second product value by multiplying a difference between said video information level of said X-axis element line representing the presumptive center position and the video information level of the X-axis element line representing the known position by a distance coefficient (jy) of said Y-axis element line;

obtaining a fourth displacement between the presumptive center position and the known position in the Y-axis direction by adding said second displacement to said second product value; and obtaining the coordinates representing the actual center position of said target pattern on the basis of the coordinates of said known position, said third displacement and said fourth displacement.

* * * * *